United States Patent
Lee et al.

(10) Patent No.: US 9,196,372 B2
(45) Date of Patent: Nov. 24, 2015

(54) FLASH MEMORY DEVICE AND A METHOD OF VERIFYING THE SAME

(71) Applicant: Samsung Electronics Co., Ltd., Suwon-si (KR)

(72) Inventors: Seungwon Lee, Yongin-si (KR); Byeonghoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 95 days.

(21) Appl. No.: 14/082,304

(22) Filed: Nov. 18, 2013

(65) Prior Publication Data

US 2014/0071769 A1    Mar. 13, 2014

Related U.S. Application Data

(62) Division of application No. 13/009,499, filed on Jan. 19, 2011, now Pat. No. 8,605,510.

(30) Foreign Application Priority Data

Feb. 3, 2010  (KR) ........................ 10-2010-0010065

(51) Int. Cl.
   *G11C 11/34*    (2006.01)
   *G11C 16/26*    (2006.01)

(52) U.S. Cl.
   CPC ...................................... *G11C 16/26* (2013.01)

(58) Field of Classification Search
   CPC ...................................................... G11C 16/26
   USPC ............................ 365/185.22, 185.21, 185.18
   See application file for complete search history.

(56) References Cited

U.S. PATENT DOCUMENTS

| | | | |
|---|---|---|---|
| 6,259,627 B1 * | 7/2001 | Wong | 365/185.21 |
| 6,288,944 B1 * | 9/2001 | Kawamura | 365/185.22 |
| 6,473,344 B2 * | 10/2002 | Kim et al. | 365/189.09 |
| 6,620,682 B1 * | 9/2003 | Lee et al. | 438/257 |
| 6,639,837 B2 * | 10/2003 | Takano et al. | 365/185.2 |
| 7,443,733 B2 * | 10/2008 | Park | 365/185.23 |
| 8,085,600 B2 * | 12/2011 | Kang | 365/185.25 |
| 8,335,110 B2 * | 12/2012 | Tanaka et al. | 365/185.18 |
| 8,605,510 B2 * | 12/2013 | Lee et al. | 365/185.22 |
| 8,929,124 B2 * | 1/2015 | Kim et al. | 365/148 |
| 2002/0176281 A1* | 11/2002 | Tang | 365/185.22 |
| 2006/0245246 A1* | 11/2006 | Lung | 365/185.3 |
| 2010/0073069 A1* | 3/2010 | Wang et al. | 327/513 |

FOREIGN PATENT DOCUMENTS

| | | |
|---|---|---|
| JP | H11-306771 A | 5/1999 |
| JP | 2002-184190 A | 6/2002 |
| JP | 2007-073093 A | 3/2007 |
| KR | 10-2002-0071708 A | 9/2002 |

* cited by examiner

*Primary Examiner* — Viet Q Nguyen
(74) *Attorney, Agent, or Firm* — Myers Bigel Sibley & Sajovec, P.A.

(57) ABSTRACT

Provided are a flash memory device and a method of verifying the same. The flash memory device includes: a memory cell for storing data; a sense amplifier for reading information of the memory cell; a load current input device for providing a load current to the sense amplifier; and a control circuit for controlling the load current input device to provide a load current during a memory cell reading operation, verifying the memory cell by using a program verify voltage if the memory cell is a programmed memory cell, and verifying the memory cell by using a compensated erase verify voltage if the memory cell is an erased memory cell.

10 Claims, 5 Drawing Sheets

FLASH MEMORY DEVICE AND A METHOD OF VERIFYING THE SAME

REFERENCE TO PRIORITY APPLICATION

This U.S. non-provisional patent application is a divisional application of U.S. patent application Ser. No. 13/009,499, filed Jan. 19, 2011 which claims priority under 35 U.S.C. §119 of Korean Patent Application No. 10-2010-0010065, filed Feb. 3, 2010, the contents of which are hereby incorporated herein by reference.

FIELD

The present invention relates to flash memory devices and, more particularly, to flash memory devices and methods of verifying the same.

BACKGROUND

Generally, a flash memory device is a nonvolatile semiconductor memory device capable of electrically performing program and erase operations. The flash memory device is receiving great attentions because of its properties of high capacity and high speed when being applied to high capacity storage devices or code memories of the latest mobile devices. The flash memory device may be classified into a NAND type flash memory and a NOR type flash memory. Among them, a cell array of the NOR type flash memory device has a structure where a plurality of memory cells are connected in parallel to one bit line. On the contrary, the NAND type flash memory has a structure where a plurality of memory cells are connected in series to one bit line.

The NOR type flash memory device stores codes for controlling internal operations. Accordingly, the NOR type flash memory device reads stored codes and uses the stored codes to perform controlling of write, read, and verify operations. The NOR type flash memory device controls various kinds of operations according to code reading, such that time delay may occur.

The NOR type flash memory device performs a read operation for verification, that is, a verify read operation, between code reading operations when a verify operation is performed. The NOR type flash memory device supplies a voltage to a memory cell in order to perform a verify read operation. The NOR type flash memory device requires a setup time (time for changing a memory cell voltage due to a voltage supply) and a recovery time (time for recovering a memory cell voltage). Accordingly, in the NOR type flash memory, time delay occurs because of the setup time and the recovery time during a verify operation. Moreover, the NOR type flash memory performs a code reading operation through a normal read operation and then performs a verify operation in the next step such that continuous read verify operations are impossible. In the NOR type flash memory, memory cells for performing a read operation are distinguished from memory cells for performing a code operations. Therefore, in order to perform a verify operation during a read operation, a code reading operation needs to be performed using additional memory cells instead of memory cells where data are stored.

As a result, time delay occurs because of a code reading operation in the NOR type flash memory.

SUMMARY

The present disclosure provides a flash memory device with a reduced time delay and a method of verifying the same.

The present disclosure also provides a flash memory device in which time delay due to a verify operation is reduced and a method of verifying the same.

Embodiments of the inventive concept provide flash memory devices including: a memory cell for storing data; a sense amplifier for reading information of the memory cell; a load current input device for providing a load current to the sense amplifier; and a control circuit for controlling the load current input device to provide a load current during a memory cell reading operation, verifying the memory cell by using a program verify voltage if the memory cell is a programmed memory cell, and verifying the memory cell by using a compensated erase verify voltage if the memory cell is an erased memory cell.

In some embodiments, the compensated erase verify voltage may be raised by an increased size of a memory cell voltage, which is due to a load current.

In other embodiments of the inventive concept, flash memory devices include: a memory cell for storing data; a first bias voltage apply device for applying a read bias voltage to the memory cell; a second bias voltage apply device for applying a verify bias voltage to the memory cell; and a control circuit for distinguishing a code reading operation from a data reading operation of the flash memory device, controlling the first bias voltage apply device to apply a read bias voltage if the distinguished operation is the code reading operation, and controlling the second bias voltage apply device to apply a verify bias voltage if the distinguished operation is the data reading operation.

In some embodiments, the control circuit may compare a first address used for a previous write operation with a newly-inputted second address during a verify operation, may determine as a data reading operation if the first address is identical to the second address, and may determine as a code reading operation if the first address is different from the second address.

In still other embodiments of the inventive concept, verifying methods of a flash memory device include: raising a voltage of a memory cell by applying a load current of a predetermined size during a memory cell information reading operation; verifying the memory cell by using a program verify voltage if the memory cell is a programmed cell; and verifying the memory cell by using a compensated erase verify voltage if the memory cell is an erased cell.

In some embodiments, the compensated erase verify voltage may be raised by an increased size of a memory cell voltage, which is due to a load current.

In even other embodiments of the inventive concept, verifying methods of a flash memory device include: distinguishing a code reading operation from a data reading operation of the flash memory device; applying a read bias voltage to a memory cell if the distinguished operation is the code reading operation; and applying a verify bias voltage to a memory cell if the distinguished operation is the data reading operation.

In some embodiments, the distinguishing of the code reading operation from the data reading operation of the flash memory device may include: comparing a first address used for a previous write operation with a newly-inputted second address during a verify operation; and determining as a verify operation if the first address is identical to the second address and determining as a reading operation if the first address is different from the second address.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

The inventive concept provides a flash memory device with a reduced operating time in a communication system and a method of verifying the same. The inventive concept uses a NOR type flash memory device as one example of a flash memory device.

Figure 1:
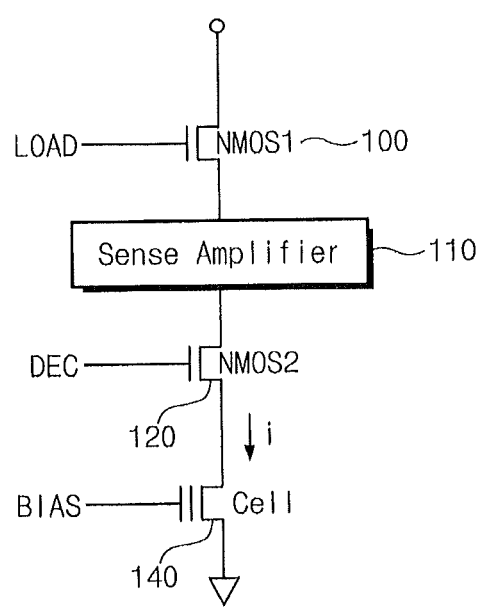
FIG. 1 is a view illustrating a structure of a NOR flash memory device for performing a verify operation according to an embodiment of the inventive concept.

FIG. 1 is a view illustrating a structure of a NOR flash memory device for performing a verify operation according to an embodiment of the inventive concept. Referring to FIG. 1, the NOR type flash memory device includes a load current input device 100, a sense amplifier 110, an N type metallic oxide semiconductor (MOS) transistor 120, and a memory cell 140. The N type MOS transistor 120 receives a decoding control signal for decoding from a control circuit (not shown) and uses the inputted decoding control signal to decode data stored in a memory cell. For example, a gate of the N type MOS transistor 120 is connected to a control circuit for providing a decoding control signal DEC, and its drain is connected to the sense amplifier 110, and its source is connected to the memory cell 140.

The memory cell 140 is a cell where data is stored. For example, a plurality of memory cells 140 may be connected in parallel to one bit line and may constitute a cell array. For convenience of description, only one memory cell 140 is used as one example. A gate of the memory cell 140 receives a bias current.

The load current input device 100 supplies a load current to the sense amplifier 110. The load current input device 100 is realized with an N type MOS transistor NMOS1 for controlling a load current, for example. Here, the load current input device 100 receives a load current control signal LOAD from a control circuit (not shown) and uses the inputted load current control signal LOAD to supply a load current to the sense amplifier 110. For example, a gate of the N type MOS transistor NMOS1 is connected to a control circuit (not shown) for providing a load current control signal, and its drain connected to a load current supply device (not shown) for supplying a load current, and its source is connected to the sense amplifier 110. Here, the load current input device 100 is realized with an N-type MOS transistor, but may be realized with a switch or a selector for connecting a load current at one side to the sense amplifier 110 through a control of a control circuit.

The sense amplifier 110 reads information of the memory cell 140 by using a load current. More specifically, the sense amplifier 110 receives information data stored in the memory cell 140 through a bit line, and amplifies and outputs the received information data, such that data stored in the memory cell 140 may be read. The control circuit controls the load current input device 100 to provide a load current to the sense amplifier 110 when information of the memory cell 140 is read. The control circuit provides a load current to the memory cell 140 through the sense amplifier 110, such that a voltage of the memory cell 140, which is one of a programmed memory cell or an erased memory cell, may be verified and read.

The control circuit applies a load current to the sense amplifier 110. Therefore, a total voltage value Vth of the memory cell 140 rises. Accordingly, a voltage value of the memory cell 140 read by the sense amplifier 110 rises because of a load current. The control circuit performs a verify operation using an existing program verify voltage when the memory cell 140 is a programmed memory cell and compensates an erase verify voltage to a memory cell voltage level, which is raised because of a rising load current, if the memory cell 140 is an erased memory cell. The control circuit verifies a voltage of an erased memory cell using the compensated erase verify voltage during a verify operation.

The NOR type flash memory device according to the inventive concept provides a load current to the sense amplifier 110 to raise a total voltage of a memory cell and compensates an erase verify voltage according to the raised total voltage of a memory cell, such that a verify voltage region of memory cells expands entirely.

Due to this, the NOR type flash memory device may perform a read operation on one code or data during one clock and also a cell voltage rise time and a cell voltage drop time for a data reading operation may be reduced, such that verify operations may be continuously performed without time delay.

Figure 2:
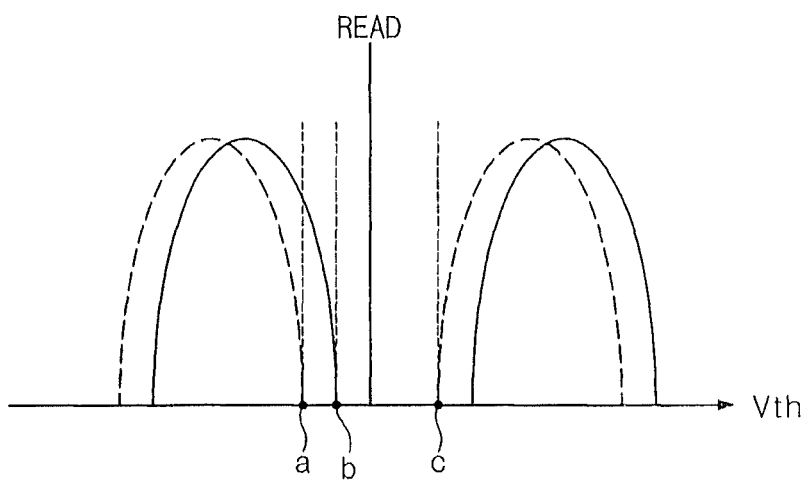
FIG. 2 is a view illustrating a threshold voltage distribution of a memory cell according to an embodiment of the inventive concept.

FIG. 2 is a view illustrating a threshold voltage distribution of a memory cell according to an embodiment of the inventive concept. Referring to FIG. 2, threshold voltages of programmed memory cells and erased memory cells are shown.

The dotted line represents a threshold voltage of an existing memory cell and the solid line represents a threshold voltage of a memory cell of which a threshold voltage value rises according to a load current supply according to the inventive concept.

a is an erase verify voltage for existing erase verification and b is an erase verify voltage of which a voltage value is compensated by an increased size of a memory cell voltage value, which is due to a load current supply. Accordingly, compared to a, b has a higher voltage value that is raised because of a load current.

c is a program verify voltage of the inventive concept and is the same as an existing program voltage.

However, since a threshold voltage of a memory cell is raised, it has the same effect like a range of a program verify voltage expands.

Figure 3:
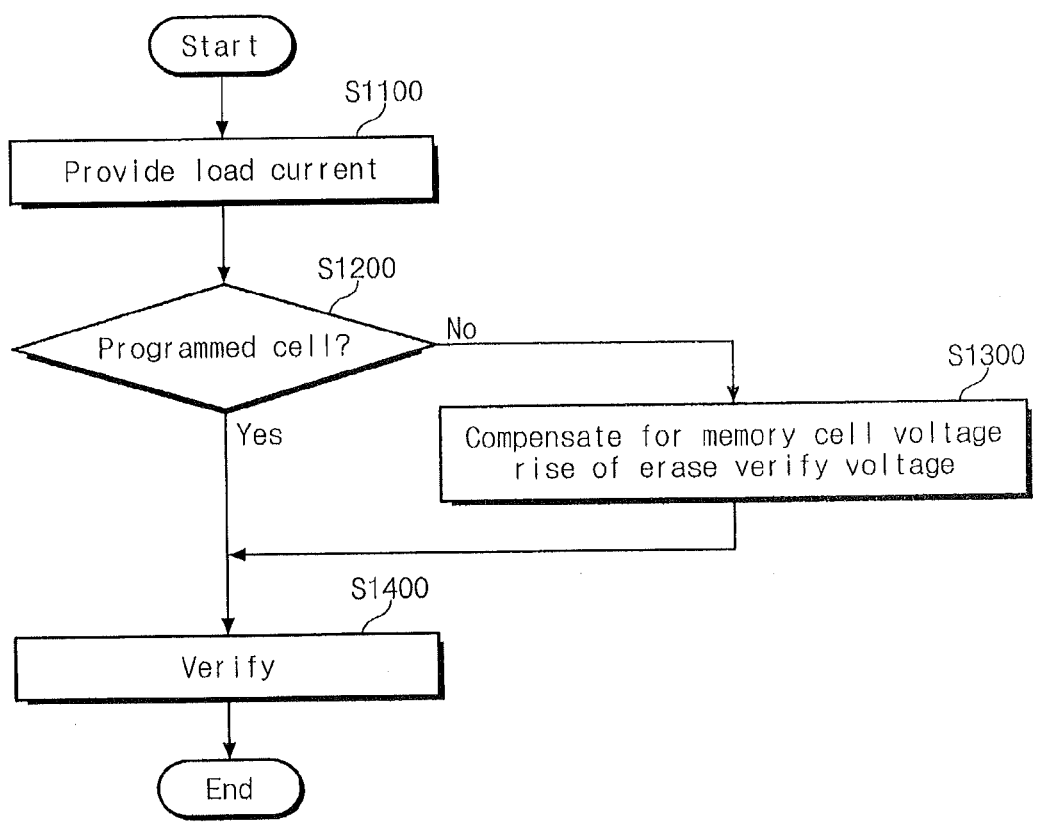
FIG. 3 is a flowchart illustrating a verify operation of a NOR type flash memory device according to an embodiment of the inventive concept.

Accordingly, the inventive concept raises a voltage of a memory cell according to applying of a load current and resets an erase verify voltage with a compensated erase verify voltage so as to correspond to the raised voltage, FIG. 3 is a flowchart illustrating a verify operation of a NOR type flash memory device according to an embodiment of the inventive concept.

Referring to FIG. 3, a NOR type flash memory device provides a load current to a sense amplifier during cell detection for verification in operation S1100 and then, proceeds to operation S1200.

In operation S1200, the NOR type flash memory device confirms whether a memory cell to be verified is a programmed cell or not.

In operation S1200, based on a confirmation result, if the memory cell to be verified is a programmed cell, it proceeds to operation S1400.

In operation S1400, the NOR type flash memory device verifies the memory cell using a program verify voltage and then, terminates the verify operation.

In operation S1200, based on a confirmation result, if the memory cell to be verified is an erased cell, it proceeds to operation S1300.

In operation S1300, the NOR type flash memory device compensates an erase verify voltage by an increased size of a memory cell voltage, which is due to a load current, and it proceeds to operation S1400.

In operation S1400, the NOR type flash memory device verifies the memory cell using the compensated erase verify voltage and then terminates the verify operation.

Figure 4:
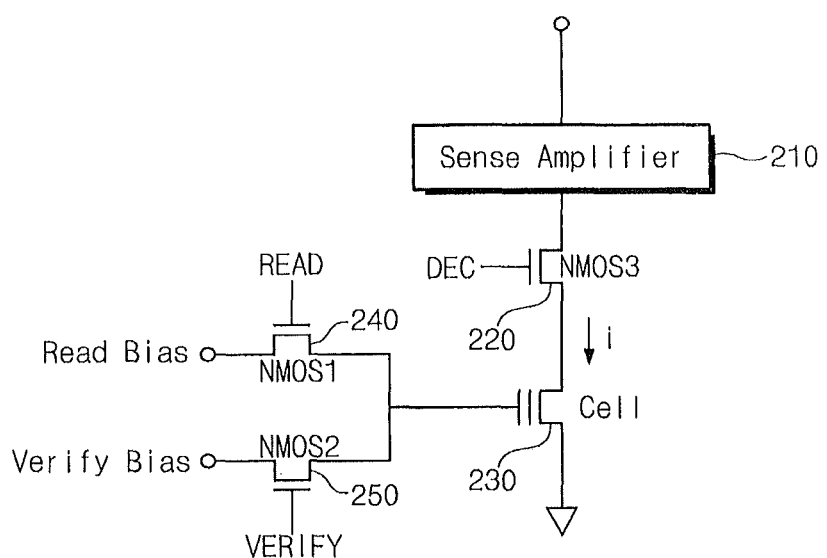
FIG. 4 is a view illustrating a structure of a NOR type flash memory device for performing a verify operation according to another embodiment of the inventive concept.

FIG. 4 is a view illustrating a structure of a NOR type flash memory device for performing a verify operation according to another embodiment of the inventive concept.

Referring to FIG. 4, the NOR type flash memory device includes a sense amplifier 210, an N type MOS transistor NMOS3 or 220, a memory cell 230, a first bias voltage apply device 240, and a second bias voltage apply device 250.

The N type MOS transistor 220 receives a decoding control signal DEC from a control circuit (not shown) and uses the inputted decoding control signal DEC to decode data stored in a memory cell.

For example, a gate of the N type MOS transistor 220 is connected to the decoding control signal DEC (e.g., a control circuit for providing the decoding control signal DEC), and its drain is connected to the sense amplifier 210, and its source is connected to the memory cell 230, The memory cell 230 is one cell where data is stored. For example, a plurality of memory cells 230 may be connected in parallel to one bit line to constitute a cell array. For convenience of description, the inventive concept uses one memory cell 230 as an example.

A gate of the memory cell 230 receives a bias current.

The first bias voltage apply device 240 includes an N type MOS transistor NMOS1, for example, and applies a read bias signal to the memory cell 230 using a read control signal READ.

For example, a gate of the N type MOS transistor NMOS1 is connected to a control circuit for providing a read control signal READ, and its drain is connected to a read bias voltage supply device for supplying a read bias voltage, and its source is connected to the memory cell 230.

The second bias voltage apply device 250 includes an N type MOS transistor NMOS2, for example, and applies a read bias signal to the memory cell 230 using a verify control signal VERIFY.

For example, a gate of the N type MOS transistor NMOS2 is connected to a control circuit for providing a verify control signal VERIFY, and its drain is connected to a verify bias voltage supply device for supplying a verify bias voltage, and its source is connected to the memory cell 230.

The first bias voltage apply device 240 and the second bias voltage apply device 250 are realized with an N type MOS transistor, for example, but may be realized with a switch or a selector for connecting a read bias or a verify bias at one side to the sense amplifier 210 through a control of a control circuit.

The control circuit provides a read control signal READ for applying a read bias to a memory cell, to the first bias voltage applying device 240 during a code reading operation, and the control circuit provides a verify control signal VERIFY for applying a verify bias to a memory cell, to the second bias voltage apply device 250 during a data reading operation.

That is, the control circuit controls a voltage that is applied to a memory cell during a verify operation by distinguishing the code reading operation from the data reading operation, and an operation for distinguishing the code reading operation from the data reading operation is as follows.

The control circuit compares a first address used for a previous write operation with a newly-inputted second address during a verify operation. It is determined as a verify operation if the first address is identical to the second address and it is determined as a read operation if the first address is different from the second address.

For this, the NOR flash memory device may further include a storage unit for storing a first address and a comparison determination unit for comparing the newly-inputted second address with the first address.

Figure 5:
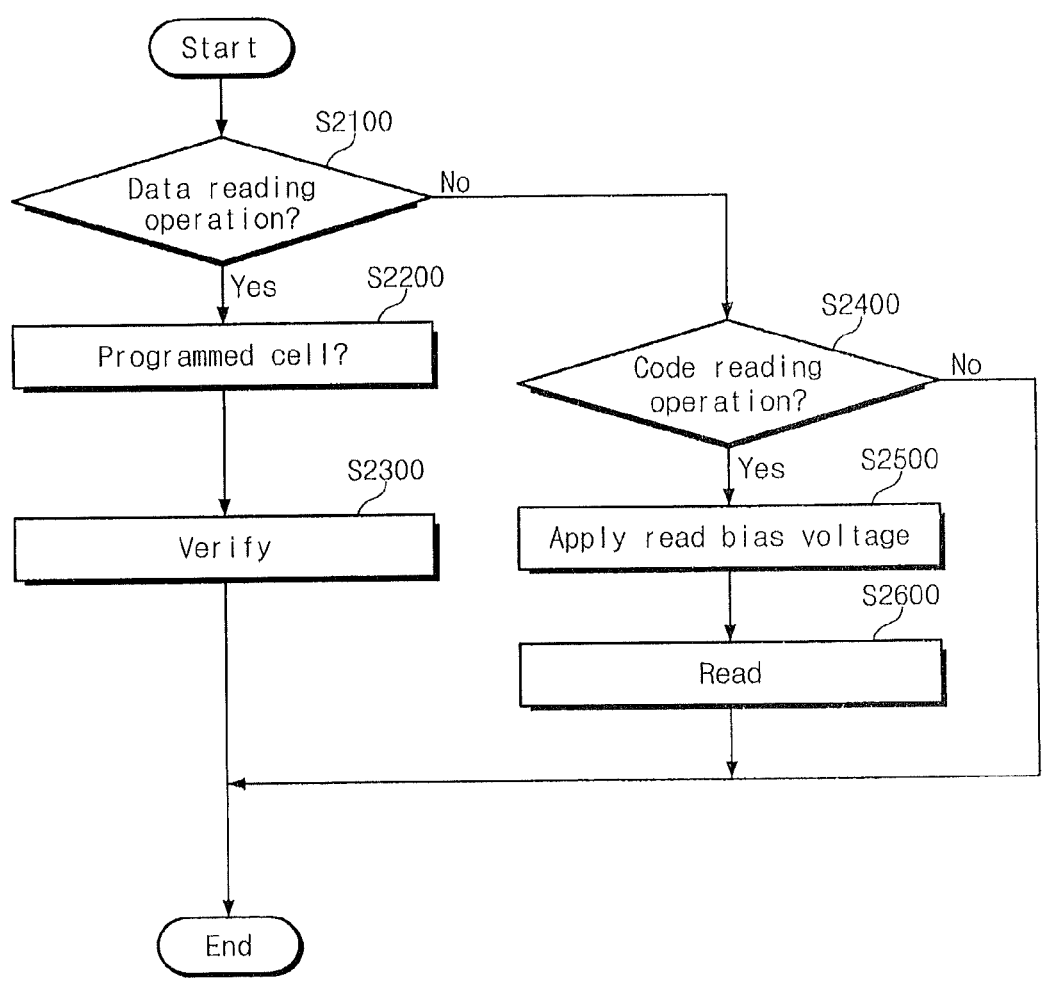
FIG. 5 is a flowchart illustrating a verify operation of a NOR type flash memory device according to another embodiment of the inventive concept.

FIG. 5 is a flowchart illustrating a verify operation of a NOR type flash memory device according to another embodiment of the inventive concept.

Referring to FIG. 5, in operation S2100, a NOR type flash memory device determines whether it is a data reading operation for applying a verify bias to a memory cell.

In operation S2100, if it is the data reading operation based on a determination result, the NOR type flash memory device proceeds to operation S2200.

In operation S2200, the NOR type flash memory device applies a verify bias voltage to a memory cell and then, proceeds to operation S2300.

In operation S2100, if it is not the data reading operation based on a determination result, the NOR type flash memory device proceeds to operation S2400.

In operation S2400, the NOR type flash memory device determines whether it is a code verify operation for applying a read bias to a memory cell.

If it is not the code verify operation based on a determination result of operation S2400, the NOR type flash memory device terminates its operation.

If it is the code verify operation based on a determination result of operation S2400, the NOR type flash memory device proceeds to operation S2500.

In operation S2500, the NOR flash memory applies a read bias voltage to the memory cell and then, proceeds to operation S2600.

In operation S2600, the NOR type flash memory device performs a read operation and terminates its operation.

The inventive concept provides a NOR type flash memory device with a reduced operating time. Moreover, the NOR type flash memory device has a reduced verification time. Furthermore, the NOR type flash memory device performs a verify and verify code reading operations in a NOR flash memory without using additional memories for reading verify codes.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A NOR type flash memory device comprising:
a memory cell configured to store, one at a time, data and a code for controlling internal operations;
a first bias voltage apply device for applying a read bias voltage to the memory cell;
a second bias voltage apply device for applying a verify bias voltage to the memory cell, wherein a magnitude of the verify bias voltage is unequal to a magnitude of the read bias voltage; and
a control circuit configured to control the first bias voltage apply device to apply the read bias voltage in response to an operation on the memory cell comprising reading the code, and configured to control the second bias voltage apply device to apply the verify bias voltage in response to the operation on the memory cell comprising reading the data.

2. The NOR type flash memory device of claim 1, wherein:
the control circuit compares a first address used for a previous write operation with a newly-inputted second address during a verify operation, determines as a data reading operation if the first address is identical to the second address, and determines as a code reading operation if the first address is different from the second address.

3. A verifying method of a NOR type flash memory device, the method comprising:
determining an operation applied to the NOR type flash memory device as being a reading a code for controlling internal operation, or a reading data operation of the NOR type flash memory device;
applying a read bias voltage to a memory cell of the NOR type flash memory device if the operation is the reading the code for controlling internal operation; and
applying a verify bias voltage to the memory cell of the NOR type flash memory device if the operation is the reading data operation,
wherein a magnitude of the verify bias voltage is unequal to a magnitude of the read bias voltage.

4. The method of claim 3, wherein the determining the operation applied to the NOR type flash memory device comprises:
comparing a first address used for a previous write operation with a newly-inputted second address during a verify operation; and
determining as a verify operation if the first address is identical to the second address and determining as a reading operation if the first address is different from the second address.

5. The NOR type flash memory device of claim 1,
wherein the operation of reading the code or reading the data occurs after a program of the memory cell, and
wherein the control circuit modifies a voltage applied to the memory cell for a subsequent program of the memory cell, after the operation of reading the code or reading the data.

6. The NOR type flash memory device of claim 1,
wherein the operation of reading the code or reading the data occurs after a program of the memory cell, and
wherein the verify bias voltage applied to the memory cell is increased for a subsequent program of the memory cell after the operation of reading the code or reading the data.

7. The NOR type flash memory device of claim 1,
wherein the verify bias voltage is less than the read bias voltage.

8. The method of claim 3, wherein the determining the operation occurs after a program of the memory cell, the method further comprising:
modifying, after the determining the operation, a voltage applied to the memory cell for a subsequent program of the memory cell.

9. The method of claim 3, wherein the determining the operation occurs after a program of the memory cell, the method further comprising:
increasing, after the determining the operation, the verify bias voltage applied to the memory cell for a subsequent program of the memory cell.

10. The method of claim 3,
wherein the verify bias voltage is less than the read bias voltage.

* * * * *